US008827494B2

(12) United States Patent
Bergeron

(10) Patent No.: US 8,827,494 B2
(45) Date of Patent: Sep. 9, 2014

(54) CIRCUIT BOARD SUPPORT STRUCTURE HAVING FIXED CIRCUIT BOARD CONNECTION DEVICE

(75) Inventor: Mathieux Bergeron, Quebec (CA)

(73) Assignee: Koninklijke Philips N.V., Eindhoven (NL)

( * ) Notice: Subject to any disclaimer, the term of this patent is extended or adjusted under 35 U.S.C. 154(b) by 48 days.

(21) Appl. No.: 13/519,422

(22) PCT Filed: Dec. 13, 2010

(86) PCT No.: PCT/IB2010/055780
§ 371 (c)(1),
(2), (4) Date: Jul. 19, 2012

(87) PCT Pub. No.: WO2011/083382
PCT Pub. Date: Jul. 14, 2011

(65) Prior Publication Data

US 2012/0300462 A1 Nov. 29, 2012

Related U.S. Application Data

(60) Provisional application No. 61/292,351, filed on Jan. 5, 2010.

(51) Int. Cl.

| | |
|---|---|
| ***F21V 21/04*** | (2006.01) |
| ***H05K 1/02*** | (2006.01) |
| ***F21V 23/06*** | (2006.01) |
| ***F21V 19/00*** | (2006.01) |
| *F21Y 101/02* | (2006.01) |
| *F21Y 105/00* | (2006.01) |
| *F21V 27/00* | (2006.01) |

(52) U.S. Cl.
CPC ............. *F21V 23/06* (2013.01); *F21Y 2101/02* (2013.01); *F21Y 2105/001* (2013.01); *F21V 27/00* (2013.01); *F21V 19/0055* (2013.01)
USPC .................. 362/249.02; 362/249.01; 362/294

(58) Field of Classification Search
CPC .................................................. F21V 19/0055
USPC ......................... 362/249.02, 249.01; 174/250
See application file for complete search history.

(56) References Cited

U.S. PATENT DOCUMENTS

| | | | |
|---|---|---|---|
| 2003/0189829 | A1 | 10/2003 | Shimizu |
| 2006/0262545 | A1 | 11/2006 | Piepgras et al. |
| 2009/0146561 | A1 | 6/2009 | Jiang |

FOREIGN PATENT DOCUMENTS

| | | | |
|---|---|---|---|
| FR | 2938047 | A1 | 5/2010 |

*Primary Examiner* — Anh T. Mai

(57) ABSTRACT

Disclosed herein is a circuit board support structure (10, 110, 810) having a circuit board connection device (20, 120, 820) fixedly received thereon. The circuit board connection device (20, 120, 820) is configured to be removably mated with a corresponding socket connection device (50, 150, 250, 850) of a circuit board (40, 140, 840) such that the circuit board (40, 140, 840) may be adjacent the circuit board support structure (10, 110, 810) when the socket connection device (50, 150, 250, 850) is mated with the circuit board connection device (20, 120, 820).

15 Claims, 6 Drawing Sheets

CIRCUIT BOARD SUPPORT STRUCTURE HAVING FIXED CIRCUIT BOARD CONNECTION DEVICE

TECHNICAL FIELD

The present invention is directed generally to a circuit board support structure having a circuit board connection device fixedly received thereon. More particularly, various inventive methods and apparatus disclosed herein relate to a circuit board support structure having a circuit board connection device fixedly received thereon, wherein the circuit board connection device is configured to be removably mated with a corresponding socket connection device of a circuit board.

BACKGROUND

Digital lighting technologies, i.e. illumination based on semiconductor light sources, such as light-emitting diodes (LEDs), offer a viable alternative to traditional fluorescent, HID, and incandescent lamps. Functional advantages and benefits of LEDs include high energy conversion and optical efficiency, durability, lower operating costs, and many others. Recent advances in LED technology have provided efficient and robust full-spectrum lighting sources that enable a variety of lighting effects in many applications.

Many lighting fixtures have been designed that implement LEDs to reap one or more of the advantages and benefits of LEDs. For example, some lighting fixtures have been designed that implement a plurality of LEDs arranged on one or more circuit boards. Each circuit board is attached to a desired support structure in the lighting fixture. Electrical connections (e.g. connections from a power supply and/or a controller) to the circuit board are then made. In some lighting fixtures the electrical connections may be made by mating a loose female connector extending from a power source and/or controller, for example, to a corresponding male connector fixed on the circuit board. While such lighting fixtures enable an electrical connection to the circuit board to be made, they require a user to manipulate wires and/or connectors in order to create the electrical connection. Likewise, they require a user to manipulate wires and/or connectors in order to remove the electrical connection in order to, for example, replace a circuit board or perform repair work or maintenance on the lighting fixture. Manipulation of the wires and/or connectors may be tedious for a user, confusing for a user, and/or may potentially lead to incorrect electrical connections being made.

Thus, there is a need in the art for a circuit board support structure having a circuit board connection device fixedly received thereon that is configured to be mated with a corresponding fixed socket connection device of a circuit board, thereby reducing the need for a user to manipulate wires when installing and/or removing the circuit board.

SUMMARY

The present disclosure is directed to inventive methods and apparatus for a circuit board support structure having a circuit board connection device fixedly received thereon, and, more particularly, various inventive methods and apparatus disclosed herein relate to a circuit board support structure having a circuit board connection device fixedly received thereon that is configured to be removably mated with a corresponding socket connection device of a circuit board. For example, the circuit board support structure may have a circuit board connection device fixedly received thereon. The circuit board connection device may be configured to mate with a corresponding socket connection device coupled to a circuit board and when the circuit board connection device mates with the socket connection device, the circuit board may be adjacent the circuit board support structure. In some embodiments the circuit board support structure may be implemented in a lighting unit having at least one circuit board having at least one light source coupled thereto. In some of those embodiments the light source may be a solid state light source such as, for example, an LED. The present disclosure may reduce the need for a user to manipulate wires when installing and/or removing a circuit board and may enable a circuit board to be appropriately aligned with respect to the circuit board support structure.

Generally, in one aspect, a lighting unit is provided that includes a circuit board support structure having a connection device recess formed therein. A circuit board connection device is fixedly received in the connection device recess. The circuit board connection device includes circuit board connection structure electrically coupled to power supply connection structure. The lighting unit also includes a circuit board having a first side and a second side. At least one light source is coupled to the first side of the circuit board. A socket connection device is fixedly coupled to the circuit board and has socket connection structure electrically coupled to the light source. The socket connection structure is removably mateable with the circuit board connection structure and at least some of the second side of the circuit board is adjacent the circuit board support structure when the socket connection structure is mated with the circuit board support structure.

In some embodiments the circuit board connection structure is oriented substantially perpendicular to the circuit board when the socket connection structure is mated with the circuit board connection structure. In some versions of these embodiments the power supply connection structure is fully received in the connection device recess.

In some embodiments the lighting unit further includes a wire pathway formed in the circuit board support structure and in communication with the power supply connection structure. In some versions of these embodiments the wire pathway is a recess extending from the connection device recess. In some versions of these embodiments at least a portion of the wire pathway extends beneath the printed circuit board when the socket connection structure is mated with the circuit board connection structure.

In some embodiments the socket connection structure is accessible through a through-board opening provided in the circuit board. In some versions of these embodiments the socket connection structure includes at least two prongs extending into the through-board opening. In some versions of these embodiments at least a portion of the circuit board connection structure extends through the through-board opening when the socket connection structure is mated with the circuit board connection structure.

Generally, in another aspect, a LED-based lighting fixture is provided that includes a lighting fixture housing. A planar LED circuit board having a first side, a second side opposite the first side, and a plurality of LEDs mounted on the first side, is retained within the lighting fixture housing and positioned along a circuit board plane. A socket connection device is fixedly coupled to the LED circuit board and has socket connection structure electrically coupled to the LEDS. A circuit board connection device is fixedly retained within the lighting fixture housing. The circuit board connection device has circuit board connection structure electrically and mechanically coupled to power supply connection structure.

The circuit board connection structure is removably electrically coupled to and removably mechanically coupled to the socket connection structure. The circuit board connection structure is oriented substantially perpendicular to the circuit board plane. The power supply connection structure is oriented substantially perpendicular to the circuit board connection structure and is interposed between the second side of the LED circuit board and an exterior of the lighting fixture housing.

In some embodiments the second side of the LED circuit board is immediately adjacent a substantially planar circuit board support area.

In some embodiments the socket connection structure is accessible through a through-board opening provided in the circuit board.

Generally, in another aspect, a circuit board support structure is provided that includes a substantially planar circuit board support area. A connection device recess is formed in the circuit board support area and a connection device is fixedly received in the connection device recess. The connection device has circuit board connection structure electrically coupled to power supply connection structure. The circuit board connection structure is oriented substantially perpendicular to the circuit board support area.

In some embodiments, the power supply connection structure is oriented substantially perpendicular to the circuit board connection structure. In some versions of these embodiments a wire pathway is formed in the circuit board support structure and is in communication with the power supply connection structure.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like. In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers). It should also be understood that the term LED does not limit the physical and/or electrical package type of an LED.

The term "light source" should be understood to refer to any one or more of a variety of radiation sources, including, but not limited to, LED-based sources (including one or more LEDs as defined above), incandescent sources (e.g., filament lamps, halogen lamps), fluorescent sources, phosphorescent sources, high-intensity discharge sources (e.g., sodium vapor, mercury vapor, and metal halide lamps), lasers, other types of electroluminescent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation galvano-luminescent sources, crystallo-luminescent sources, kine-luminescent sources, thermo-luminescent sources, triboluminescent sources, sonoluminescent sources, radioluminescent sources, and luminescent polymers.

The term "lighting fixture" is used herein to refer to an implementation or arrangement of one or more lighting units in a particular form factor, assembly, or package. The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources.

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

In the following detailed description, for purposes of explanation and not limitation, representative embodiments disclosing specific details are set forth in order to provide a thorough understanding of the claimed invention. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the claimed invention. For example, various embodiments of the apparatus disclosed herein are particularly suited for use in conjunction with a circuit board having a plurality of LEDs for implementation in a LED-based lighting unit. Accordingly, for illustrative purposes, the claimed invention is discussed in conjunction with such a lighting unit. However, other configurations and applications of the apparatus are contemplated without deviating from the scope or spirit of the claimed invention.

Figure 1:
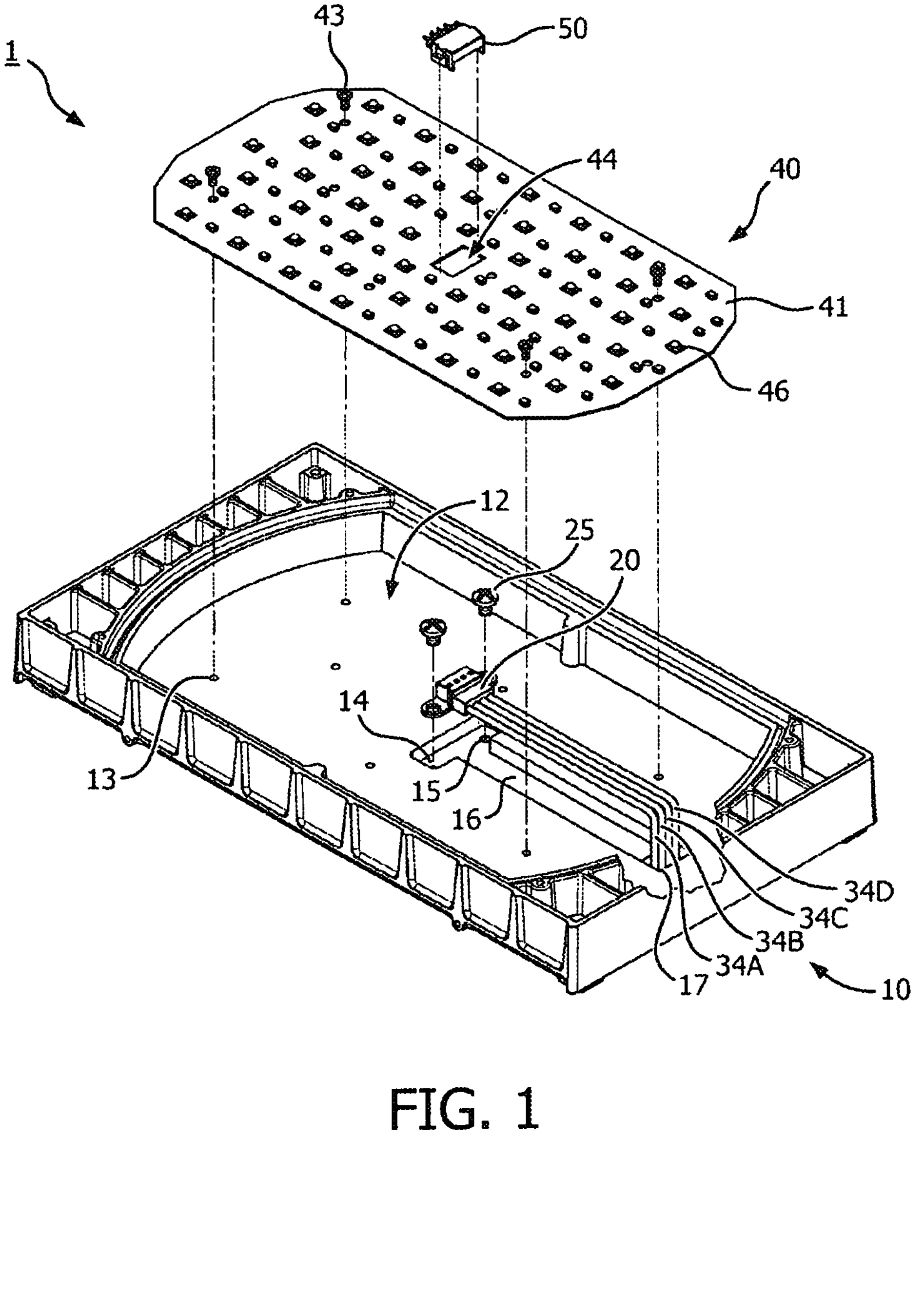
FIG. 1 illustrates an exploded view of a first embodiment of a lighting unit having a first embodiment of a circuit board support structure; a portion of the circuit board support structure is broken away; a circuit board connection device of the circuit board support structure is exploded away from the circuit board support structure; a circuit board of the lighting unit is exploded away from the circuit board support structure; and a socket connection device is exploded away from the circuit board.
Figure 2:
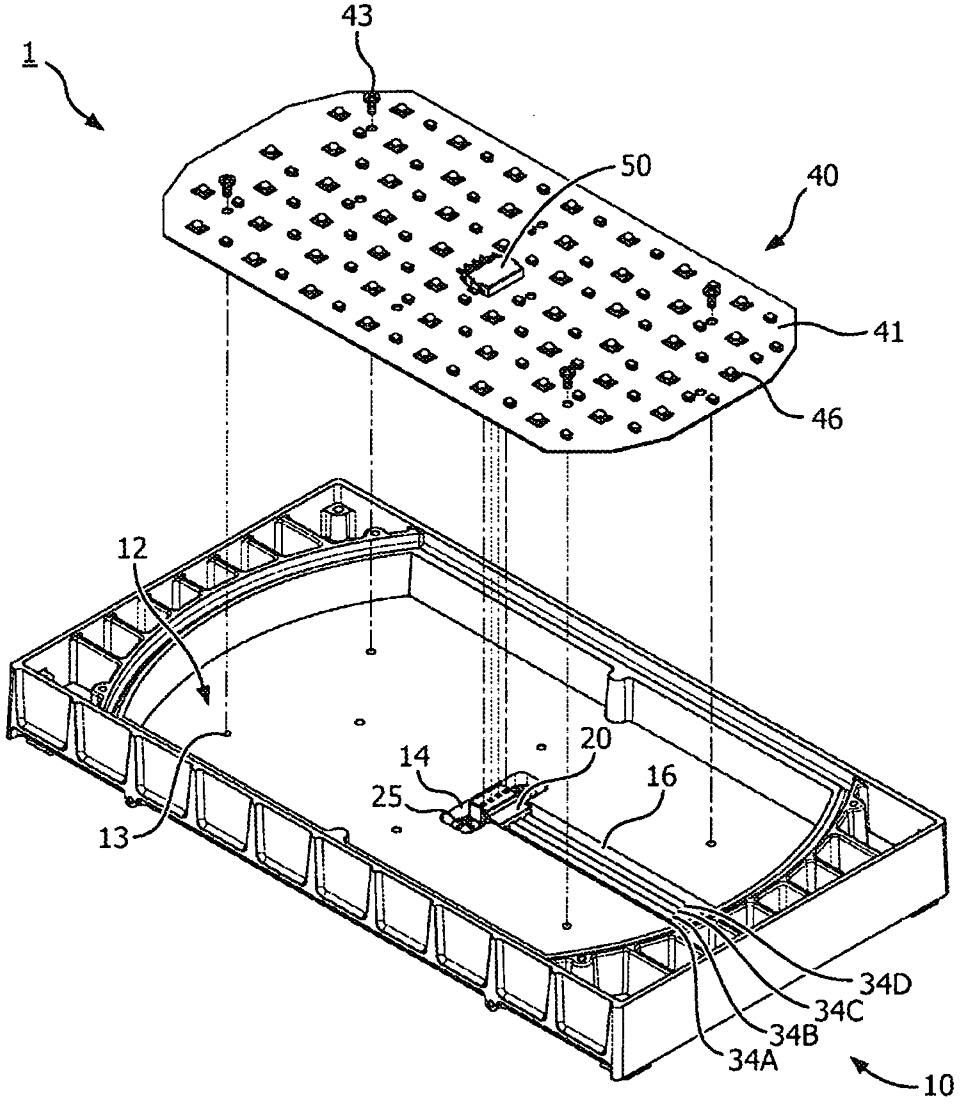
FIG. 2 illustrates the first embodiment of the lighting unit of FIG. 1; the circuit board connection device is in a fixed position; the circuit board of the lighting unit is exploded away from the circuit board support structure; and the socket connection device is in a fixed position.

Referring to FIG. 1 through FIG. 4, various aspects of a first embodiment of a lighting unit 1 having a first embodiment of a circuit board support structure 10 are shown. Referring initially to FIG. 1 and FIG. 2, a circuit board connection device 20 of the circuit board support structure 10 is shown exploded away from the circuit board support structure 10 in FIG. 1 and is shown unexploded and in a fixed position in FIG. 2. The circuit board support structure 10 may be attached to or placed within a separate housing to create a lighting fixture. Alternatively, the circuit board support structure 10 may form all or part of a lighting fixture housing. The circuit board support structure 10 includes a substantially planar circuit board support area 12. Sidewalls surround the circuit board support area 12 and include heat dissipating structure extending therefrom. A connection device recess 14 is formed in the circuit board support area 12 and includes a pair of fastener apertures 15. The circuit board connection device 20 may be fixedly received in the connection device recess 14 by inserting fasteners 25 through fastener openings 26A and 26B (see FIG. 3) of circuit board connection device 20 and securing the fasteners 25 in fastener apertures 15. In alternative embodiments the circuit board connection device 20 may be otherwise fixedly received in the connection device recess 14. For example, the connection device 20 may be attached using mechanical affixation methods, including, but not limited to adhesives, welding, soldering, prongs, fasteners, and/or structure that may extend from connection device 20 and/or circuit board support area 12.

A wire pathway 16 extends from the connection device recess 14 toward an opening 17 provided through the circuit board support structure 10. The wire pathway 16 is sized to allow wires 34A-D to pass thethrough. The wires 34A-D are in electrical communication with the circuit board connection device 20 and may be placed in electrical communication with one or more power supplies and/or controllers. For example, the circuit board support structure 10 may be coupled to a housing in communication with opening 17. The housing may optionally be coupled to circuit board support structure 10. The wires 34A-D may pass through the opening 17 and into the housing where they may be connected to one or more power supplies and/or controllers within the housing. For example, in some embodiments wires 34A-B may be coupled to a first LED driver within the housing and wires 34C-D may be coupled to a second LED driver within the housing. Also, for example, in some embodiments wires 34A-B may be coupled to a first LED driver within the housing and wires 34C-D may be coupled to a controller that sends electrical signals to alter one or more characteristics of the LEDs 46. In some embodiments more or less than four wires 34A-D may be provided and circuit board connection device 20 may optionally be modified to accommodate more or less wires.

A circuit board 40 of the lighting unit 1 is shown exploded away from the circuit board support structure 10 in both FIG. 1 and FIG. 2. The circuit board 40 has a through-board socket connection device 50 that is shown exploded away from a through-board opening 44 of the circuit board 40 in FIG. 1 and unexploded in a fixed position over the through-board opening 44 in FIG. 2. The circuit board 40 includes a first side 41, a second side opposite the first side 41, and a plurality of LEDs 46. The LEDs 46 are mounted to the first side 41 of the circuit board 40 and are in electrical connectivity with the socket connection device 50. The socket connection device 50 of the circuit board 40 is removably mateable with the circuit board connection device 20 of the circuit board support structure 10. When the socket connection device 50 is mated with the circuit board connection device 20, the circuit board 40 is adjacent the circuit board support area 12 of the circuit board support structure 10 and is appropriately aligned with respect to the circuit board support structure 10. Additionally, when the socket connection device 50 is mated with the circuit board connection device 20, they are electrically connected with one another. As a result, LEDs 46 and/or other electronics of circuit board 40 may be electrically connected to a power supply and/or controller via the connection between the socket connection device 50 (which may be electrically connected to LEDs 46 or other electronics of the circuit board 40) and circuit board connection device 20 (which may be electrically connected to a power supply and/or a controller).

In some embodiments the circuit board 40 may contact the circuit board support area 12 of the circuit board support structure 10 when the socket connection device 50 is mated with the circuit board connection device 20. Contact between the circuit board 40 and the circuit board support area 12 may, in some embodiments, enable heat transfer between the circuit board 40 and the circuit board support area 12 and/or may help reduce movement of the circuit board 40. In some embodiments a material, such as, for example, a heat transfer material may be interposed between the circuit board 40 and the support area 12. In some embodiments the support area 12 may take on alternative configurations. For example, the support area 12 may contain one or more recesses in addition to the connection device recess 14 and/or the wire pathway 16 such as, for example, a plurality of troughs extending underneath the circuit board 40, a trough extending along the periphery of the circuit board 40, a trough extending under a majority of the circuit board 40, and/or a plurality of selectively placed recesses. Also, for example, the support area 12 may contain one or more protrusions extending therefrom such as, for example, a plurality of bumps extending therefrom and/or one or more alignment notches extending therefrom.

In some embodiments, after the socket connection device 50 has been mated with the circuit board connection device 20, fasteners 43 may be inserted through apertures in the circuit board 40 and fastened into corresponding fastener apertures 13 of the circuit board support structure 10 to further secure circuit board 40 to the circuit board support structure 10. In other embodiments the circuit board 40 may be secured to the circuit board support structure 10 solely via mating between the socket connection device 50 and the circuit board connection device 20. In some embodiments the circuit board 40 may be further secured to the circuit board support structure 10 using alternative fixation methods. For example, alternative mechanical affixation apparatus may be used, including, but not limited to, prongs, fasteners, clips, depending structure and the like that extend from circuit board 40 and/or circuit board support structure 10 and interface with corresponding structure of the other of circuit board 40 and/or circuit board support structure 10. Also, for example, alternative mechanical affixation apparatus may include one or more magnets in or coupled to circuit board 40 and/or circuit board support structure 10 that interact with one or more corresponding magnets or ferrous material in or coupled to the other of circuit board 40 and/or circuit board support structure 10.

Figure 3:
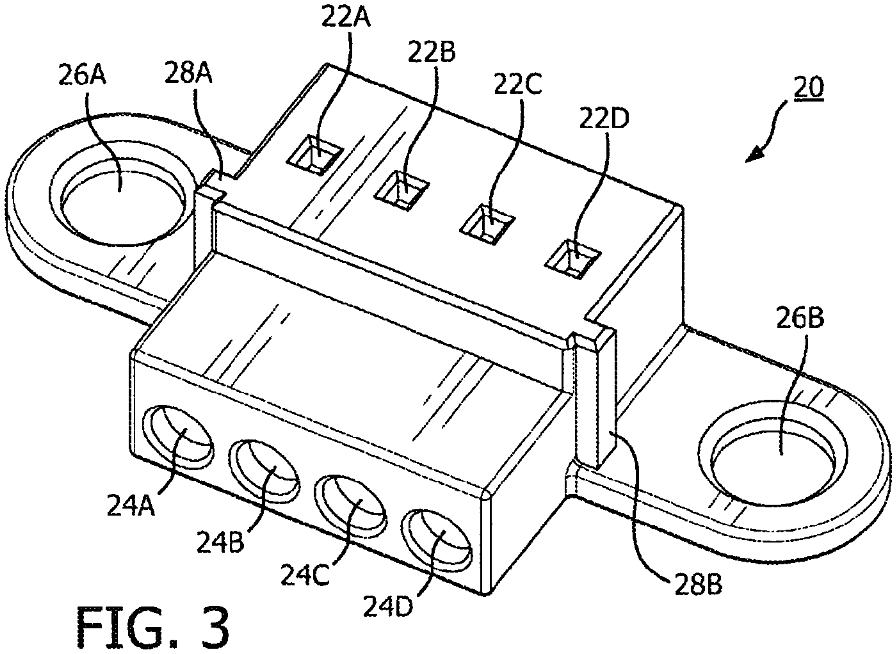
FIG. 3 illustrates a perspective view of the circuit board connection device of the circuit board support structure of FIG. 1.

Referring particularly to FIG. 3, the circuit board connection device 20 is shown in additional detail. The circuit board connection device 20 has circuit board connection structure that includes female circuit board connection apertures 22A-D that are configured to receive and be electrically connected with corresponding male protrusions such as, for example, male protrusions 52A-D (shown in FIG. 4) of socket connection device 50. The circuit board connection device 20 also has power supply connection structure that includes female power supply connection apertures 24A-D that are in electrical communication with respective of circuit board connection apertures 22A-D. The power supply connection apertures 24A-D are configured to receive and be electrically connected with electrical wiring such as, for example, electrical wiring 34A-D (shown in FIGS. 1 and 2), thereby placing the electrical wiring in electrical connectivity with circuit board connection apertures 22A-D. The power supply connection apertures 24A-D are oriented substantially perependicular to the circuit board connection apertures 22A-D. The depicted power supply connection apertures 22A-D may employ any desired apparatus and method for securing electrical wires thereto. For example, one or more quick connection apparatus (e.g. one or more arms that engage the electrical wire when inserted, a spring loaded contact point that engages the electrical wire), and/or a crimped connection, and/or a soldered connection may be used. Fastener openings 26A and 26B are provided through respective of support wings 25A and 25B and, as described in additional detail herein, may be used in conjunction with fasteners to fixedly secure the circuit board connection device 20. Alignment protrusions 28A and 28B are provided on opposed sides of the circuit board connection device 20 and interact with alignment slots 58A and 58B (shown in FIG. 4) of socket connection device 50 to help provide proper alignment between circuit board connection device 20 and socket connection device 50.

When the circuit board connection device 20 is fixedly received in the connection device recess 14, the depicted circuit board connection apertures 22A-D are oriented substantially perpendicular to the support surface 12 and to the circuit board 40 when the socket connection device 50 is mated with the circuit board connection device 20. In the depicted embodiment the circuit board connection apertures 22A-D extend above a plane generally defined by the support surface 12 and will extend into and through the through-board opening 44 when the socket connection device 20 is mated with the circuit board connection device 20. In alternative embodiments the circuit board connection device 20 may be designed such that the circuit board connection apertures 22A-D do not extend through (and potentially not even into) the through the through-board opening 44 when the socket connection device 50 is mated with the circuit board connection device 20. When the circuit board connection device 20 is fixedly received in the connection device recess 14, the power supply connection apertures 24A-D are oriented substantially parallel to the support surface 12 and the direction of the wire pathway 16. The power supply connection apertures 24A-D are also oriented substantially parallel to the circuit board 40 when the socket connection device 50 is mated with the circuit board connection device 20.

Figure 4:
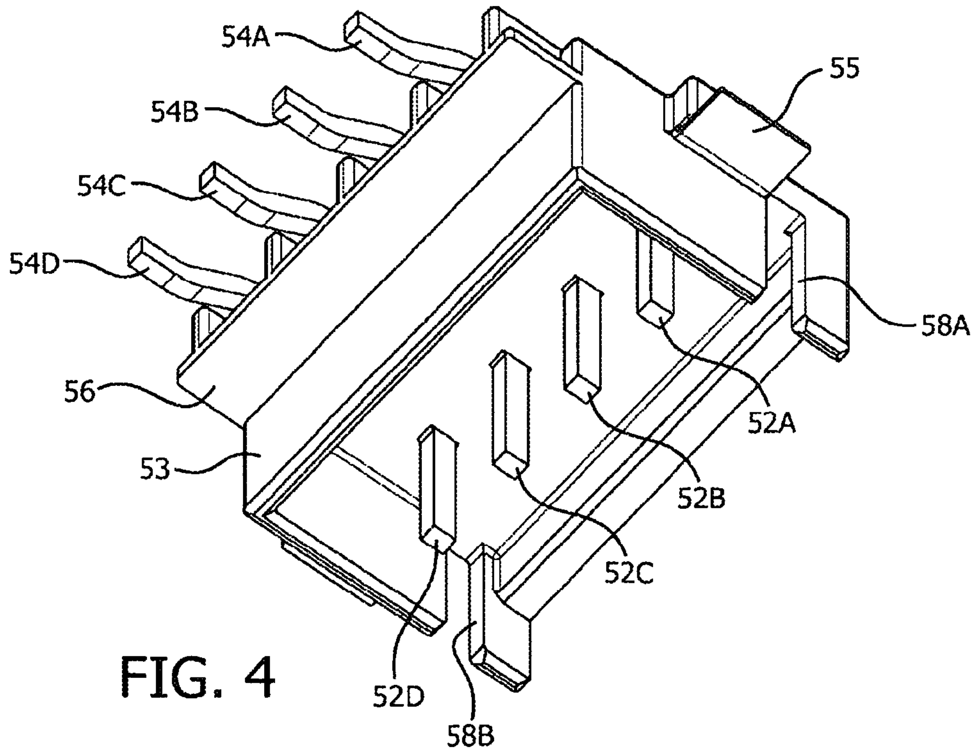
FIG. 4 illustrates a perspective view of the socket connection device of the lighting unit of FIG. 1.

Referring particularly to FIG. 4, the socket connection device 50 of the circuit board 40 is shown in additional detail. The socket connection device 50 is a through-board connection device, meaning that it connects with the circuit board connection device 20 via an opening provided through a circuit board such as, for example, the through-board opening 44 through circuit board 40. In alternative embodiments the through-board opening 44 may be non-centrally provided on the circuit board 40 and may optionally be provided along the periphery of the circuit board 40. Connection structure of the socket connection device 50 and/or connection structure of the circuit board connection device 20 may extend into and/or through the through-board opening 44 to create the mated connection between the two.

The socket connection device 50 has male socket connecting prongs 52A-D extending downwardly therefrom that are in electrical communication with corresponding of circuit board leads 54A-D. The socket connecting prongs 52A-D are configured to be received in and in electrical connectivity with corresponding circuit board connection apertures 22A-D of circuit board connection device 20. Circuit board leads 54A-D are configured to be soldered to and in electrical connectivity with corresponding leads of the circuit board 40 that are in electrical communication with one or more LEDs 46 of the circuit board 40. In alternative embodiments the circuit board leads 54A-D may be configured to be otherwise be connected with corresponding leads of the circuit board 40. A wall 53 is provided about socket connecting prongs 52A-D and may help minimize unintended contact between socket connecting prongs 52A-D and other items and/or may help align socket connection device 50 with the circuit board connection device 20. Side flange 55 and front flange 56 extend perpendicularly from the shielding wall 53 and are substantially coplanar with one another. The side flange 55 and/or the front flange 56 may interact with first side 41 of the circuit board 40 to help align and/or secure the socket connection device 50 to the circuit board 40. For example, the side flange 55 and front flange 56 may contact the first side 41 of the circuit board 40 to ensure the socket connecting prongs 52A-D are at a desired location with respect to the through-board opening 44. Also, for example, an adhesive may be interposed between the side flange 55 and/or the front flange 56 and the first side 41 of the circuit board 40 to thereby fix the socket connection device 50 to the circuit board 40.

In the depicted embodiment the socket connecting prongs 52A-D extend into the through-board opening 44 when the socket connection device 50 is mated with the circuit board connection device 20, but not completely through the through-board opening 44. In alternative embodiments the socket connection device 50 may be designed such that the socket connecting prongs 52A-D would not extend into the through-board opening 44 when the socket connection device 50 is mated with the circuit board connection device 20 or, alternatively may be designed such that the socket connecting prongs 52A-D would extend completely through through-board opening 44.

The connection structure depicted in conjunction with circuit board connection device 20 is female connection structure and the connection structure depicted in conjunction with socket connection device 50 is shown as being male connection structure. However, one of ordinary skill in the art, having had the benefit of the present disclosure, would appreciate that some or all of the connection structure of circuit board connection device 20 may be male connection structure and/or some or all of the connection structure of socket connection device 50 may be female connection structure.

Figure 5:
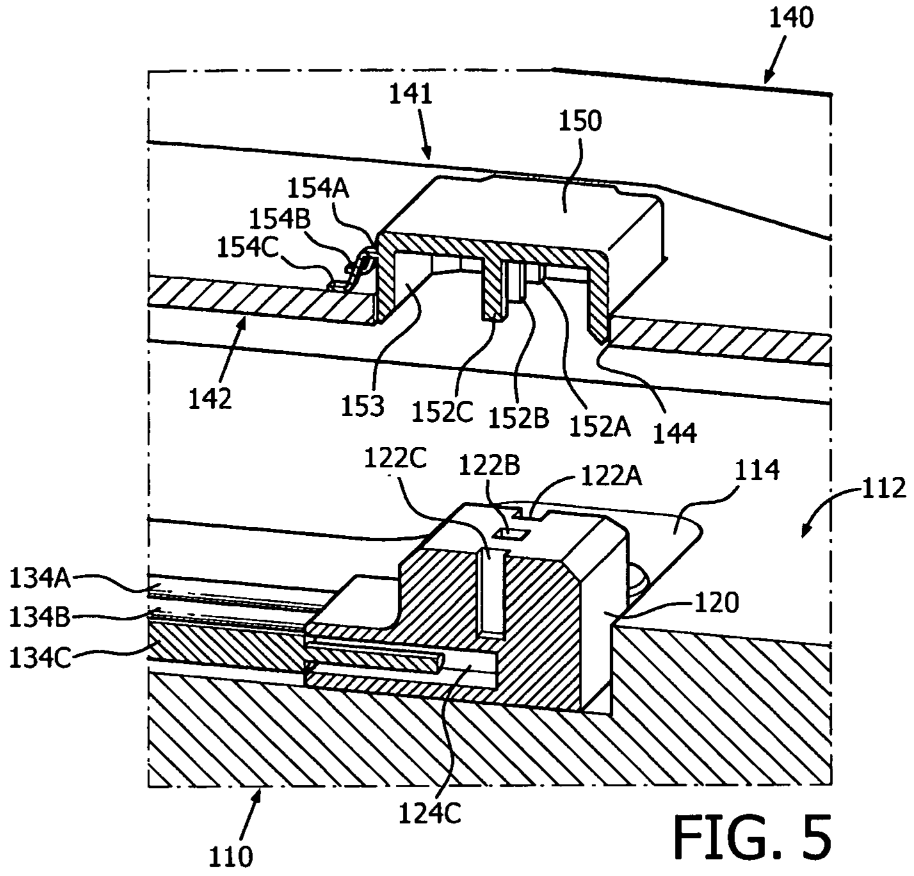
FIG. 5 illustrates a perspective section view of a portion of a second embodiment of a circuit board support structure and a circuit board connection device thereof; a perspective section view of a circuit board and a though-board socket connection device are also shown; the socket connection device and the circuit board connection device are shown unattached and spaced apart from one another.
Figure 6:
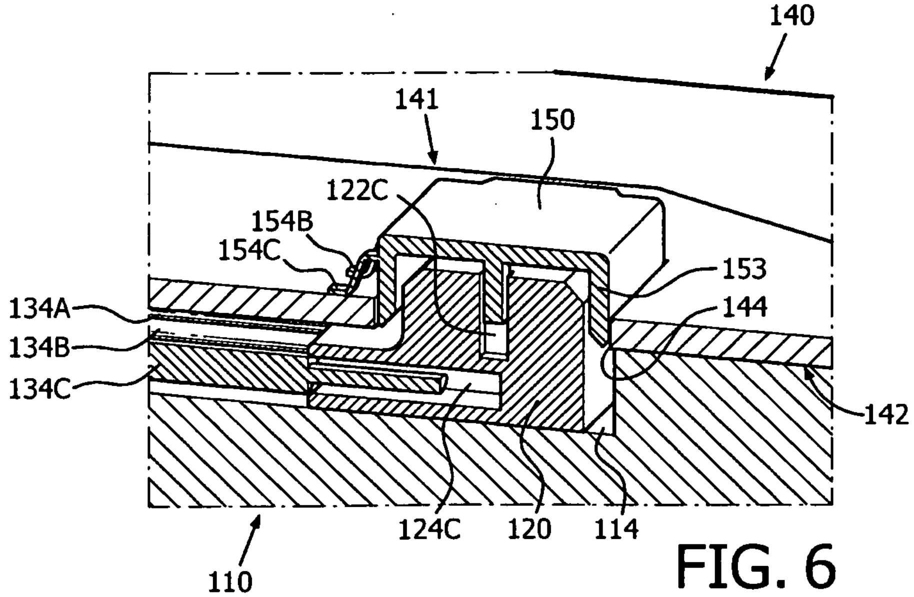
FIG. 6 illustrates the circuit board support structure and the circuit board of FIG. 5; the socket connection device and the circuit board connection device are shown mated with one another.

FIG. 5 and FIG. 6 illustrate a perspective section view of a portion of a second embodiment of a circuit board support structure 110 having a circuit board support area 112 and a connection device recess 114. A circuit board connection device 120 is fixedly rececived in the connection device recess 114. Female circuit board connection apertures 122A-C are visible in the section view and are in electrical communication with respective of female power supply connection apertures, of which power supply connection aperture 124C is visible. The power supply connection apertures are electrically connected with respective of electrical wiring 134A-C and are also in electrical connectivity with circuit board connection apertures 22A-C. Electrical wiring 134C is visible extending into power supply connection aperture 124C. As described herein, structure may optionally be included in power supply connection aperture 124C to contact and/or retain electrical wiring 134C.

A circuit board 140 is also shown and includes a first side 141, a second side 142, and a through-board opening 144. A socket connection device 150 is in a fixed position over the through-board opening 144 and extends into, but not completely through the through-board opening 144. The socket connection device 150 includes male prongs 152A-C that are in electrical connectivity with circuit board leads 154A-C. The circuit board leads 154A-C are in electrical communication with electronics of the circuit board 140 via corresponding leads of the circuit board 140.

The socket connection device 150 of the circuit board 140 is removably mateable with the circuit board connection device 120 of the circuit board support structure 110. The socket connection device 150 and the circuit board connection device 120 are shown unattached and spaced apart from one another in FIG. 5. In FIG. 6 socket connection device 150 and the circuit board connection device 120 are shown mated with one another. The circuit board 140 is adjacent the circuit board support area 112 of the circuit board support structure 110. The circuit board connection apertures 122A-C extend into and through the through board opening 144.

Figure 7:
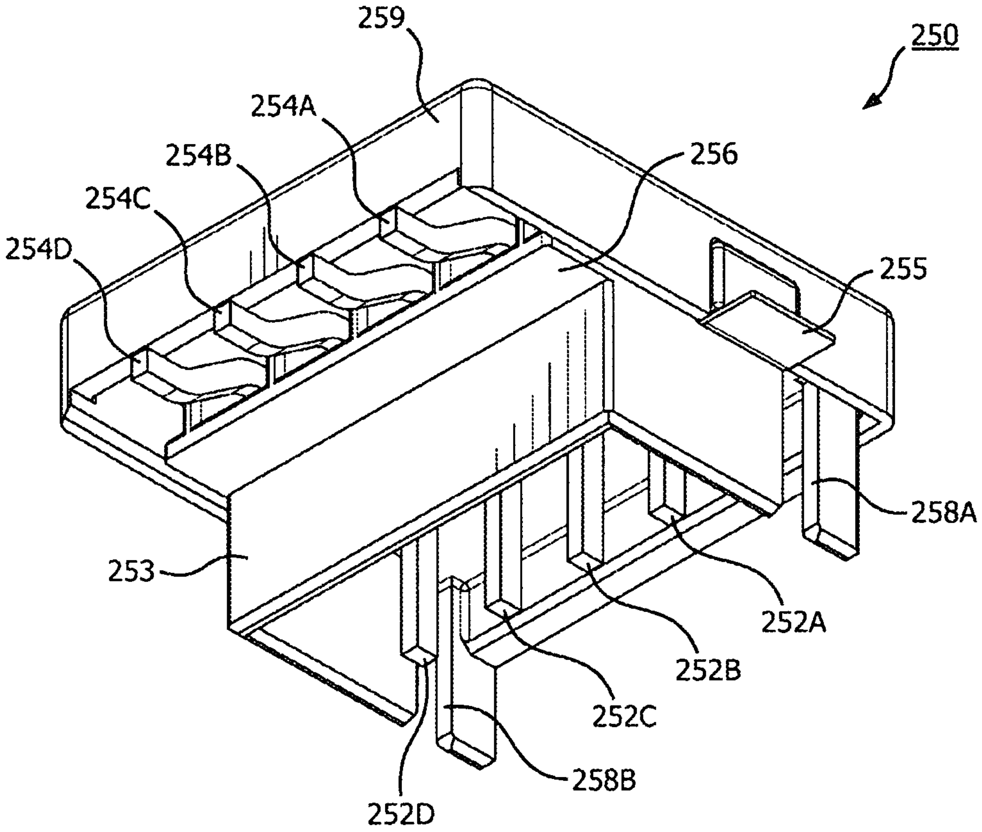
FIG. 7 illustrates a second embodiment of a socket connection device.

FIG. 7 illustrates a second embodiment of a socket connection device 250. Socket connection device 250 and socket connection device 50 are similar to one another and like reference numerals refer to like parts of the two. Socket connection device 250 does differ from socket connection device 50 in that it features a socket connection hood 259 that is provided atop circuit board leads 254A-D. Socket connection hood 259 minimizes the likelihood of unintended electrical contact with circuit board leads 254A-D.

Figure 8:
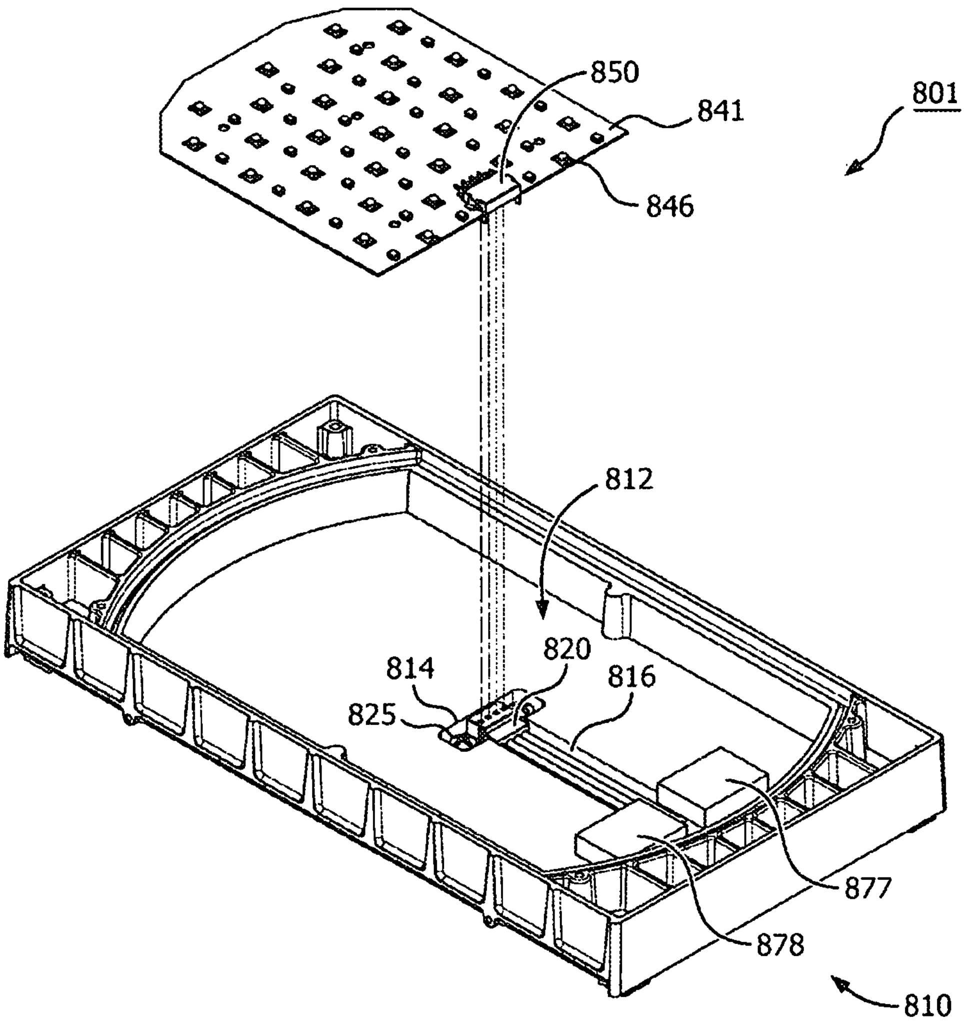
FIG. 8 illustrates an exploded view of an additional embodiment of a lighting unit having a third embodiment of a circuit board support structure; a circuit board of the lighting unit is exploded away from the circuit board support structure.

FIG. 8 illustrates an exploded view of an additional embodiment of a lighting unit 801. Lighting unit 801 is similar to lighting unit 1 and like reference numerals refer to like parts of the two. However, lighting unit 801 varies from lighting unit 1 in several respects. For example, circuit board 840 is approximately half the size of circuit board 40 and features approximately half the amount of LEDs 846. Also, for example, socket connection device 850 is provided through a through-board opening along the periphery of the circuit board 840. Also, for example, no fastener apertures are provided in circuit board support structure 810 and circuit board 840 will be secured solely through the mating of socket connection device 850 and circuit board connection device 820. Also, for example, wires 834A-D do not extend through a hole in circuit board support structure 810, but, rather, remain in wire pathway 816 until reaching respective electrical connections with an LED driver 877 and a controller 878 that are mounted to the circuit board support structure 810. Also, for example, wires 834A-D and wire pathway 816 do not extend underneath of circuit board 840 after socket connection device 850 is mated with circuit board connection device 820.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles “a” and “an,” as used herein in the specification and in the claims, unless clearly indicated to the contrary, should be understood to mean “at least one.”

The phrase “and/or,” as used herein in the specification and in the claims, should be understood to mean “either or both” of the elements so conjoined, i.e., elements that are conjunctively present in some cases and disjunctively present in other cases. Multiple elements listed with “and/or” should be construed in the same fashion, i.e., “one or more” of the elements so conjoined. Other elements may optionally be present other than the elements specifically identified by the “and/or” clause, whether related or unrelated to those elements specifically identified. Thus, as a non-limiting example, a reference to “A and/or B”, when used in conjunction with open-ended language such as “comprising” can refer, in one embodiment, to A only (optionally including elements other than B); in another embodiment, to B only (optionally including elements other than A); in yet another embodiment, to both A and B (optionally including other elements); etc.

As used herein in the specification and in the claims, “or” should be understood to have the same meaning as “and/or” as defined above. For example, when separating items in a list, “or” or “and/or” shall be interpreted as being inclusive, i.e., the inclusion of at least one, but also including more than one, of a number or list of elements, and, optionally, additional unlisted items. Only terms clearly indicated to the contrary, such as “only one of” or “exactly one of,” or, when used in the claims, “consisting of,” will refer to the inclusion of exactly one element of a number or list of elements. In general, the term “or” as used herein shall only be interpreted as indicating exclusive alternatives (i.e. “one or the other but not both”) when preceded by terms of exclusivity, such as “either,” “one of,” “only one of,” or “exactly one of.” “Consisting essentially of,” when used in the claims, shall have its ordinary meaning as used in the field of patent law.

As used herein in the specification and in the claims, the phrase “at least one,” in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase “at least one” refers, whether related or unrelated to those elements specifically identified. Thus, as a non-limiting example, “at least one of A and B” (or, equivalently, “at least one of A or B,” or, equivalently “at least one of A and/or B”) can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited. Also, any reference numerals or other characters, appearing between parentheses in the claims, are provided merely for convenience and are not intended to limit the claims in any way.

What is claimed is:

1. A lighting unit, comprising:

a circuit board support structure having a connection device recess formed therein;

a circuit board connection device fixedly received in said connection device recess, said circuit board connection device having circuit board connection structure electrically coupled to power supply connection structure;

a circuit board having a first side, a second side, and circuit board electrical leads;

a plurality of individual LED packages coupled to said first side of said circuit board and electrically coupled to at least some of said electrical leads of said circuit board;

a socket connection device fixedly coupled to said circuit board and having socket connection structure electrically coupled to said plurality of individual LED packages via said electrical leads of said circuit board;

wherein said socket connection structure is removably mateable with said circuit board connection structure; and wherein at least some of said second side of said circuit board is adjacent said circuit board support structure when said socket connection structure is mated with said circuit board support structure.

2. The lighting unit of claim 1 wherein said circuit board connection structure is oriented substantially perpendicular to said circuit board when said socket connection structure is mated with said circuit board connection structure.

3. The lighting unit of claim 2 wherein said power supply connection structure is fully received in said connection device recess.

4. The lighting unit of claim 1, further comprising a wire pathway formed in said circuit board support structure, said wire pathway in communication with said power supply connection structure.

5. The lighting unit of claim of claim 4 wherein said wire pathway is a recess extending from said connection device recess.

6. The lighting unit of claim of claim 4 wherein at least a portion of said wire pathway extends beneath said printed circuit board when said socket connection structure is mated with said circuit board connection structure.

7. The lighting unit of claim of claim 1 wherein said socket connection structure is accessible through a through-board opening provided in said circuit board.

8. The lighting unit of claim of claim 7 wherein said socket connection structure includes at least two prongs extending into said through-board opening.

9. The circuit board support structure of claim 7 wherein at least a portion of said circuit board connection structure extends through said through-board opening when said socket connection structure is mated with said circuit board connection structure.

10. The lighting unit of claim 1, wherein said circuit board connection structure extends beyond said second side of said circuit board when said socket connection structure is mated with said circuit board connection structure.

11. The lighting unit of claim 10, wherein said circuit board connection structure extends beyond said first side of said circuit board when said socket connection structure is mated with said circuit board connection structure.

12. The lighting unit of claim 1, wherein said circuit board support area is substantially planar.

13. The lighting unit of claim 1, wherein said power supply connection structure is oriented substantially perpendicular to said circuit board connection structure.

14. The lighting unit of claim 1, wherein said LED packages are positionally offset from and in non-axial alignment with said circuit board connection device.

15. The lighting unit of claim 1, wherein some of said LED packages may be operated independently of other of said LED packages.

* * * * *